United States Patent
Hauff et al.

(10) Patent No.: US 11,955,941 B2
(45) Date of Patent: Apr. 9, 2024

(54) RADIO FREQUENCY FILTERED INTERFACE

(71) Applicant: RAYTHEON COMPANY, Waltham, MA (US)

(72) Inventors: John W. Hauff, Marlborough, MA (US); Orlando F. Perez, Holden, MA (US); John F. Magnani, Framingham, MA (US)

(73) Assignee: RAYTHEON COMPANY, Waltham, MA (US)

( * ) Notice: Subject to any disclaimer, the term of this patent is extended or adjusted under 35 U.S.C. 154(b) by 188 days.

(21) Appl. No.: 17/383,382

(22) Filed: Jul. 22, 2021

(65) Prior Publication Data

US 2022/0029595 A1     Jan. 27, 2022

Related U.S. Application Data

(60) Provisional application No. 63/056,067, filed on Jul. 24, 2020.

(51) Int. Cl.
*H03H 1/00*     (2006.01)
*H01R 13/66*    (2006.01)

(52) U.S. Cl.
CPC ......... *H03H 1/0007* (2013.01); *H01R 13/665* (2013.01); *H03H 2001/0085* (2013.01)

(58) Field of Classification Search
CPC . H03H 1/0007; H01R 13/665; H01R 13/6658
USPC .......................................................... 333/185
See application file for complete search history.

(56) References Cited

U.S. PATENT DOCUMENTS

| | | |
|---|---|---|
| 6,106,305 A | 8/2000 | Kozel et al. |
| 6,882,247 B2 | 4/2005 | Allison et al. |
| 9,692,188 B2 | 6/2017 | Godana et al. |
| 2011/0090719 A1 | 4/2011 | Benjamin |

FOREIGN PATENT DOCUMENTS

| | | |
|---|---|---|
| EP | 0028657 A1 | 5/1981 |
| EP | 0190940 A2 | 8/1986 |

*Primary Examiner* — Rakesh B Patel
(74) *Attorney, Agent, or Firm* — CANTOR COLBURN LLP (57) ABSTRACT

A connector including a first body, a second body, a dielectric film and one or more conductive traces. The first body has first and second opposite sides and includes an elastomeric absorber material with ferrite or iron powder dispersed therein. The second body includes the elastomeric absorber material with ferrite or iron powder dispersed therein. The dielectric film is disposed on surfaces of the first body to extend along and between the first and second opposite sides. The one or more conductive traces are sandwiched between the second body and the dielectric film to extend along and between the first and second opposite sides. The connector can be installed into a conductive aperture, to channel RF energy through it and thus effecting an absorptive RF filter for a signal.

20 Claims, 6 Drawing Sheets

RADIO FREQUENCY FILTERED INTERFACE

DOMESTIC PRIORITY

This application claims priority to U.S. Provisional Application Ser. No. 63/056,067, filed Jul. 24, 2020, the contents of which are incorporated by reference herein in its entirety.

BACKGROUND

The present disclosure relates to filtered interfaces and, in particular, to a radio frequency (RF) filtered interface.

Capacitive feedthroughs have been used as an effective filter in some cases. At millimeter wave RF frequencies however (i.e., frequencies greater than 30 GHz), capacitive feedthrough dimensions are far too large to implement and devices that offer little or no filtering have been the standard. Detrimental effects of the resulting RF leakage, such as crosstalk that is hard to control, have been accepted in industrial applications.

For example, elastomeric connectors have been used to provide direct current (DC) to the monolithic microwave integrated circuit (MMIC) amplifiers that are typically installed in high-level assemblies. These elastomeric connectors provide little to no RF filtering and this lack of filtering causes RF crosstalk, oscillations and gain variations between MMIC assemblies.

SUMMARY

According to an aspect of the disclosure, a connector is provided and includes a first body having first and second opposite sides and including an elastomeric absorber material with ferrite or iron powder dispersed therein, a second body including the elastomeric absorber material with ferrite or iron powder dispersed therein, a dielectric film disposed on surfaces of the first body to extend along and between the first and second opposite sides and one or more conductive traces sandwiched between the second body and the dielectric film to extend along and between the first and second opposite sides.

In accordance with additional or alternative embodiments, the elastomeric absorber material with ferrite or iron powder dispersed therein includes at least one of silicone or epoxy.

In accordance with additional or alternative embodiments, the elastomeric absorber material with ferrite or iron powder dispersed therein attenuates radio frequency (RF) energy in a frequency range of about 30 GHz to about 50 GHz.

In accordance with additional or alternative embodiments, the elastomeric absorber material with ferrite or iron powder dispersed therein has a Shore A hardness of about 50.

In accordance with additional or alternative embodiments, the one or more conductive traces includes one of a conductive sheet and/or multiple groups of proximal conductive traces.

According to an aspect of the disclosure, a filter interconnect assembly is provided and includes first and second wiring boards, a conductive housing defining an aperture between the first and second wiring boards and a connector disposable in the aperture. The connector includes a first body having first and second opposite sides facing the first and second wiring boards, respectively, and including an elastomeric absorber material with ferrite or iron powder dispersed therein, a second body including the elastomeric absorber material with ferrite or iron powder dispersed therein, a dielectric film disposed on surfaces of the first body to extend along and between the first and second opposite sides and one or more conductive traces sandwiched between the second body and the dielectric film to electrically connect the first and second wiring boards.

In accordance with additional or alternative embodiments, the conductive housing is formed to define one or more apertures and one or more connectors are disposable in each of the one or more apertures.

In accordance with additional or alternative embodiments, the elastomeric absorber material with ferrite or iron powder dispersed therein includes at least one of silicone or epoxy.

In accordance with additional or alternative embodiments, the elastomeric absorber material with ferrite or iron powder dispersed therein attenuates radio frequency (RF) energy in a frequency range of about 30 GHz to about 50 GHz.

In accordance with additional or alternative embodiments, the elastomeric absorber material with ferrite or iron powder dispersed therein has a Shore A hardness of about 50.

In accordance with additional or alternative embodiments, the one or more conductive traces includes a conductive sheet.

In accordance with additional or alternative embodiments, the one or more conductive traces includes multiple groups of proximal conductive traces.

According to an aspect of the disclosure, a filter interconnect assembly is provided and includes first and second wiring boards, a conductive housing defining an aperture between the first and second wiring boards and a connector disposable in the aperture to permit direct current (DC) to flow between the first and second wiring boards. The connector is slightly longer than the aperture and deformable in the aperture with the first and second wiring boards flush with the housing and is configured to attenuate radio frequency (RF) energy in a predefined frequency range.

In accordance with additional or alternative embodiments, the conductive housing is formed to define one or more apertures and one or more connectors are disposable in each of the one or more apertures.

In accordance with additional or alternative embodiments, the connector includes elastomeric absorber material with ferrite or iron powder dispersed therein.

In accordance with additional or alternative embodiments, the connector attenuates radio frequency (RF) energy in a frequency range of about 30 GHz to about 50 GHz.

In accordance with additional or alternative embodiments, a length of the connector defines the predefined frequency range at which the RF energy is attenuated.

In accordance with additional or alternative embodiments, the connector has a Shore A hardness of about 50.

According to an aspect of the disclosure, a monolithic microwave integrated circuit (MMIC) assembly is provided and includes an MMIC die, first and second waveguides, a microstrip connecting the first and second waveguides to the MMIC die and a filter interconnect assembly according to claim 14. Both of the first and second wiring boards are separated from each other by the conductive housing, the conductive housing defines one or more apertures between the first and second wiring boards, one or more connectors are disposable in each of the one or more apertures to permit direct current (DC) to flow between the first and second wiring boards, and the one or more connectors are slightly longer than the one or more apertures and are deformable in the one or more apertures with the first and second wiring boards flush with the housing and are configured to attenuate radio frequency (RF) energy in a predefined frequency range.

In accordance with additional or alternative embodiments, each of the one or more connectors attenuates radio frequency (RF) energy in a frequency range of about 30 GHz to about 50 GHz and has a Shore A hardness of about 50.

Additional features and advantages are realized through the techniques of the present disclosure. Other embodiments and aspects of the disclosure are described in detail herein and are considered a part of the claimed technical concept. For a better understanding of the disclosure with the advantages and the features, refer to the description and to the drawings.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

As will be described below, an elastomeric connector 101 is provided in which ferrite or iron powder is embedded in silicone or, in the case of a rigid connector, epoxy. The embedded ferrite or iron powder effectively absorbs RF signals and therefore provides for RF rejection without any degradation to the passage of DC power through the elastomeric connector.

Figure 1:
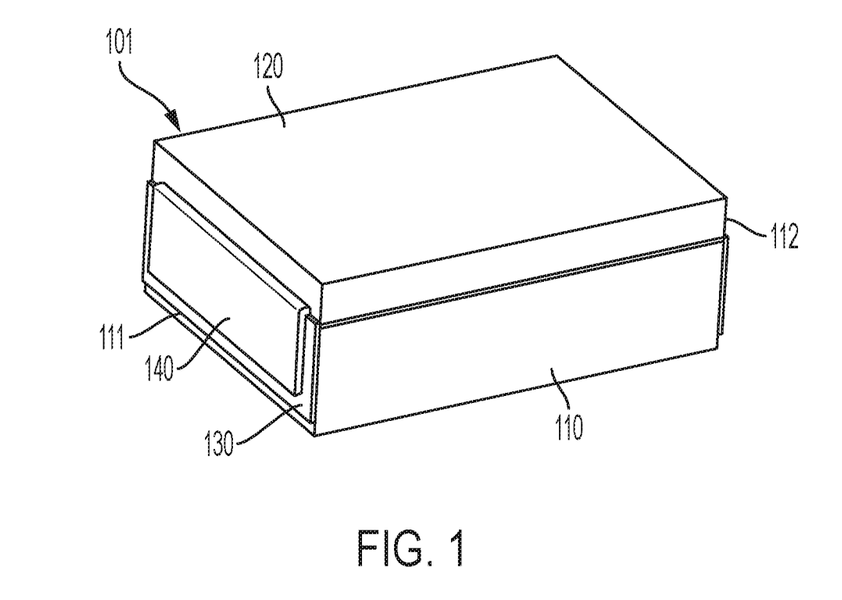
FIG. 1 is a perspective view of a connector in accordance with embodiments.

With reference to FIG. 1, the elastomeric connector 101 includes a first body 110, a second body 120, a dielectric film 130 and one or more conductive traces 140. The first body 110 has a first side 111 and a second side 112 opposite the first side 111 and includes an elastomeric absorber material with ferrite or iron powder dispersed therein. The second body 120 also includes the elastomeric absorber material with ferrite or iron powder dispersed therein. The dielectric film 130 is disposed on surfaces of the first body 120 to extend along and between at least the first and second opposite sides 111 and 112. The one or more conductive traces 140 are sandwiched between at least the second body 120 and the dielectric film 130 to extend along and between the first and second opposite sides 111 and 112.

Figure 2:
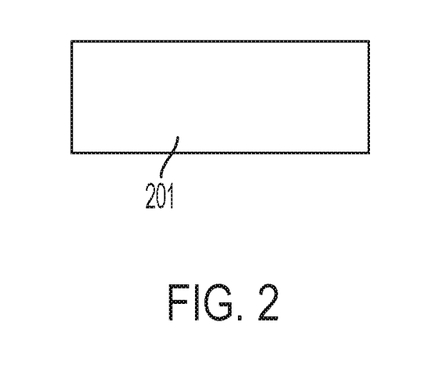
FIG. 2 is a top down view of a conductive trace of the connector of FIG. 1 in a form of a sheet in accordance with embodiments.
Figure 3:
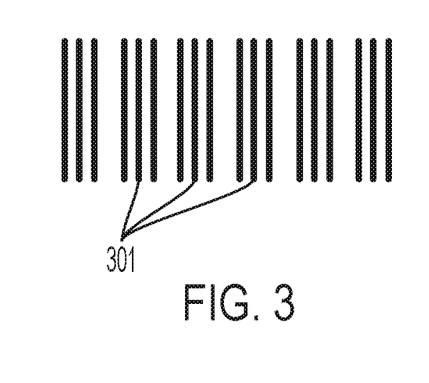
FIG. 3 is a top down view of a conductive trace of the connector of FIG. 1 in a form of multiple groups of proximal conductive traces in accordance with embodiments.

With reference to FIGS. 2 and 3, the one or more conductive traces can include or be provided as a single conductive sheet 201 (see FIG. 2) and/or as multiple groups of proximal conductive traces 301 (see FIG. 3), such as multiple parallel gold wires.

In accordance with embodiments, the elastomeric absorber material with ferrite or iron powder dispersed therein of the first and second bodies 110 and 120 can include silicone, epoxy (in the case of a rigid or relatively rigid connector) or other similar materials and combinations thereof and the dielectric film 130 can include a polyimide or other similar materials. In general, the elastomeric absorber material with ferrite or iron powder dispersed therein attenuates RF energy in a frequency range of about 30 GHz to about 50 GHz, for example, and can have a Shore A hardness of about 50.

Figure 4:
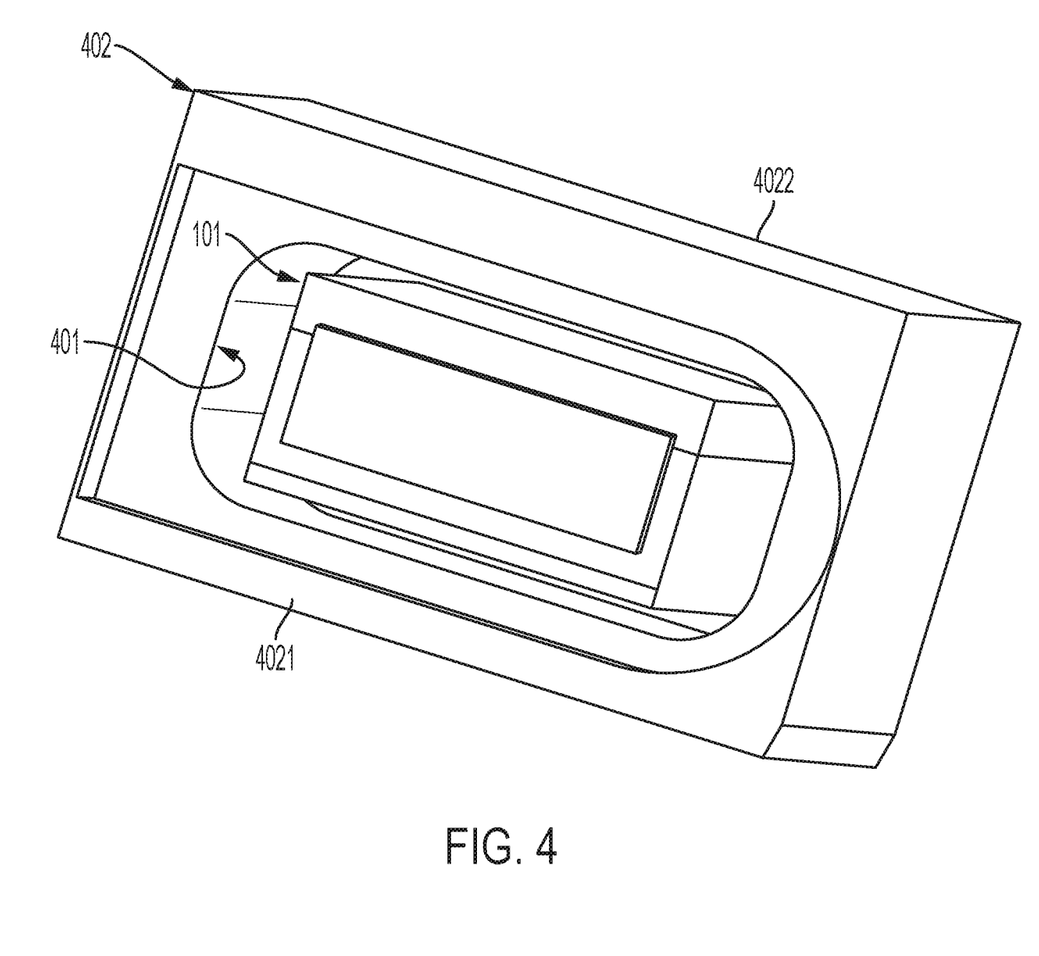
FIG. 4 is a perspective view of a filter interconnect assembly in accordance with embodiments.
Figure 5:
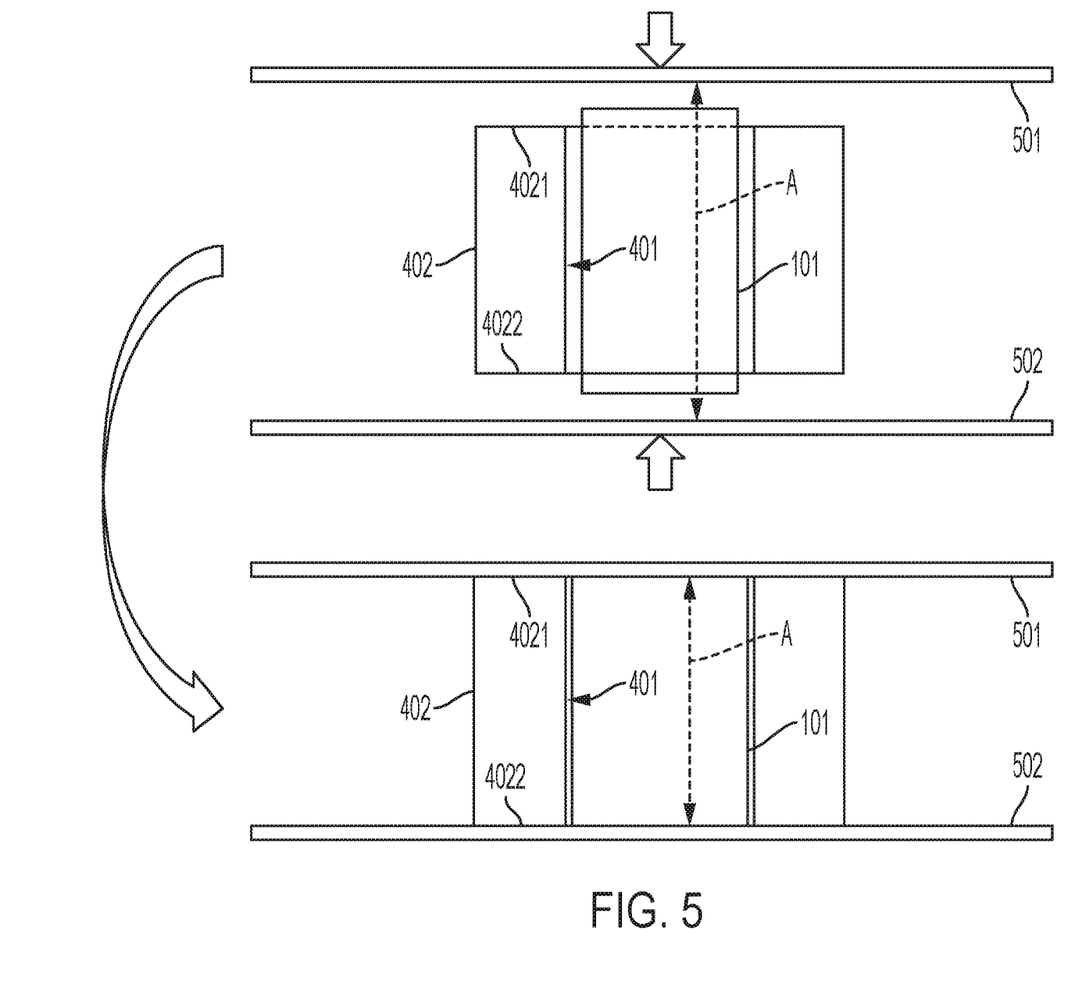
FIG. 5 is a side view of an illustration of a filter interconnect assembly disposed between wiring boards in accordance with embodiments.

With reference to FIGS. 4 and 5, the connector 101 of FIG. 1 can be provided for use in a device in which the connector 101 is disposable in an aperture 401 that is defined by, disposed in or formed in a conductive housing 402 to permit direct current (DC) to flow between first and second wiring boards 501 and 502 on either side 4021, 4022 of the conductive housing 402. In these or other cases, the connector 101 is slightly longer in the axis A (see FIG. 5) than the aperture 401. The connector 101 is deformable in the aperture 401, by virtue of the elastomeric absorber material with ferrite or iron powder dispersed therein and the Shore A hardness of the connector 101, with the first and second wiring boards 501 and 502 disposed in flush abutment with the sides 4021, 4022 of the conductive housing 402 (see FIG. 5). The connector 101 is further configured to permit DC to flow between the first and second wiring boards 501 and 502 while attenuating RF energy in a predefined frequency range (e.g., about 30 GHz to about 50 GHz).

In some cases, one or more connectors 101 can be disposed in the aperture 401.

In accordance with embodiments, a size of the connector 101 of FIG. 1 can be about 115×90×45 mils and the conductive housing 402 of FIG. 4 can be sized such that the aperture 401 is larger than the connector 101 in multiple dimensions perpendicular to the axis A (i.e., the height and width dimensions of the connector 101). Thus, when the first and second wiring boards 501 and 502 are brought into flush contact with the sides 4021, 4022 of the conductive housing 402, the first and second wiring boards 501 and 502 compress the connector 101 and cause the connector 101 to deform in at least one of the multiple dimensions perpendicular to the axis A (see FIG. 5) while providing for DC flow between the first and second wiring boards and while attenuating the RF energy in the predefined frequency.

In accordance with further embodiments, a length of the connector 101 can define the predefined frequency range at which the RF energy is attenuated. That is, a longer implementation will function at lower frequencies whereas a shorter implementation would be useful at high frequencies.

The elastomeric absorber material with ferrite or iron powder dispersed therein of the first and second bodies 110 and 120 of the connector 101 can operate over a relatively wide temperature range. In addition, the deformation of the connector 101 in the aperture 402 can result in the connector 101 being resistant to damage due to vibration or effects thereof and the DC flow can transfer DC operating voltages and large currents without degradation.

Figure 6:
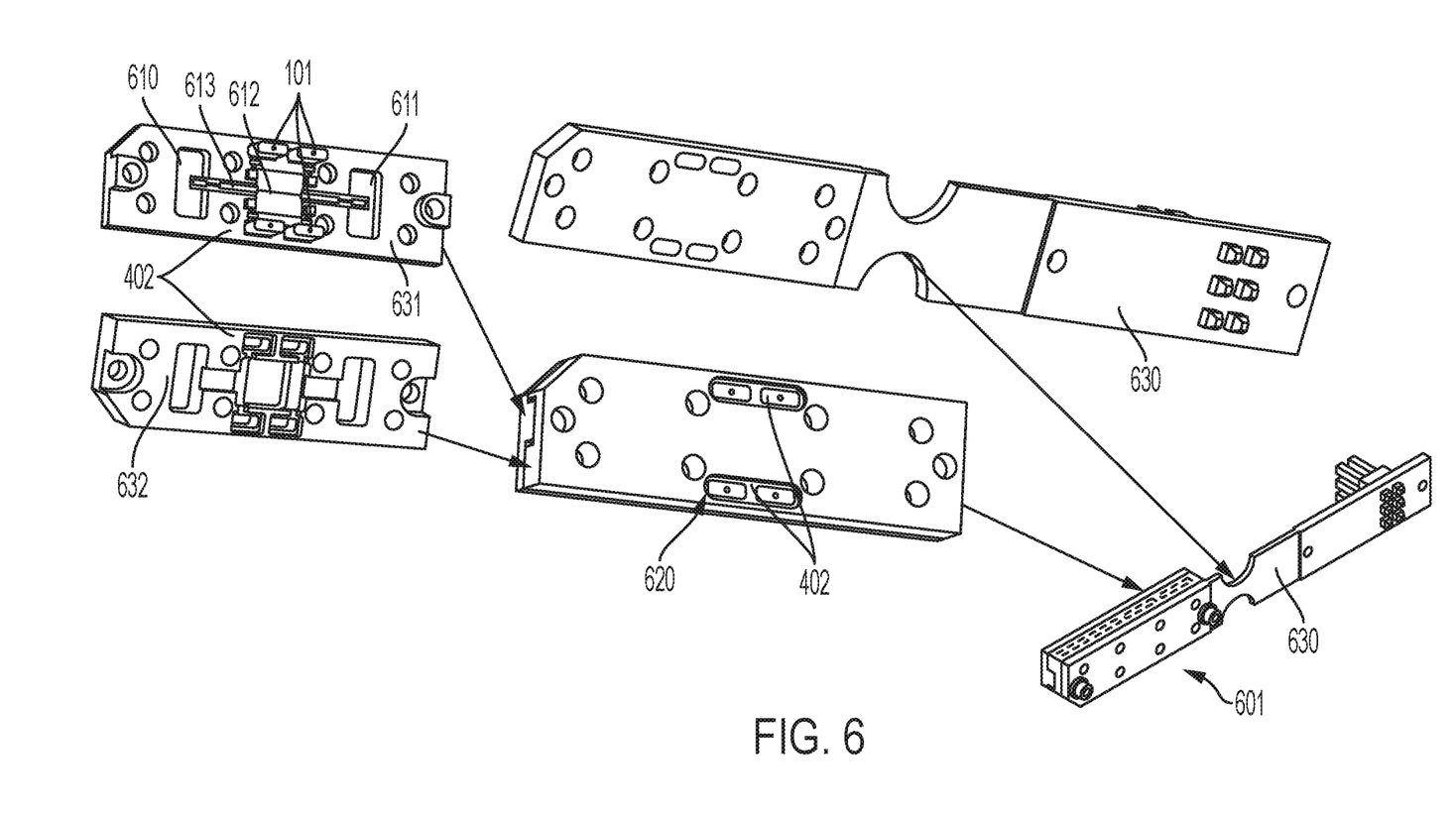
FIG. 6 shows the various part details of an assembly of a monolithic microwave integrated circuit (MMIC) in accordance with embodiments.

With reference to FIG. 6, an MMIC amplifier assembly 601 is provided and includes a first waveguide 610, a second waveguide 611, an MMIC die 612 and a microstrip 613 disposed to connect the first and second waveguides 610 and 611 to the MMIC die 612. The MMIC amplifier assembly 601 further includes filter interconnect assemblies 620 that provide DC bias to the MMIC die 612. As shown in FIG. 6, each filter interconnect assembly 620 includes a connector 101 and a conductive housing 402 as described above with respect to FIGS. 1, 4 and 5.

At least one or both of the first and second wiring boards (one pictured in FIG. 6 as a single substrate 630 for purposes of clarity and brevity, the other four substrates are mounted to the carrier 631 under the connectors 101) are separated from each other by the cover 632. The conductive housing 402 is formed as a two-part interlockable conductive housing and defines one or more of the apertures 401 between the first and second wiring boards located in the cover 632. One or more of the connectors 101 are disposable in each of the one or more apertures 401 to permit DC to flow between the first and second wiring boards. The one or more connectors 101 are each slightly longer than the one or more apertures 401 as described above and are deformable in each of the one or more apertures 401 with the first and second wiring boards flush with the conductive housing and are configured to attenuate radio frequency (RF) energy in a predefined frequency range.

Figure 7:
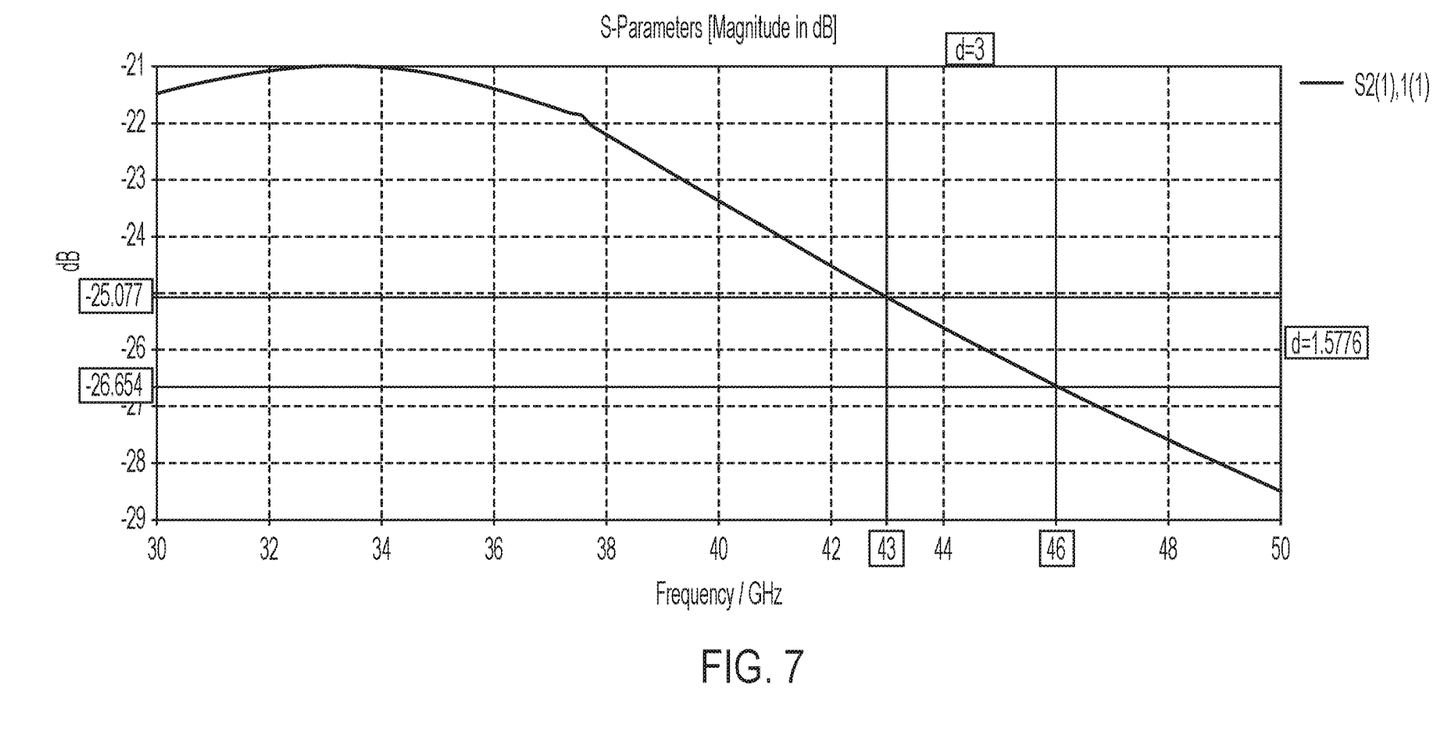
FIG. 7 is a graphical depiction of a performance of a connector in terms of insertion loss in a frequency band of interest.
Figure 8:
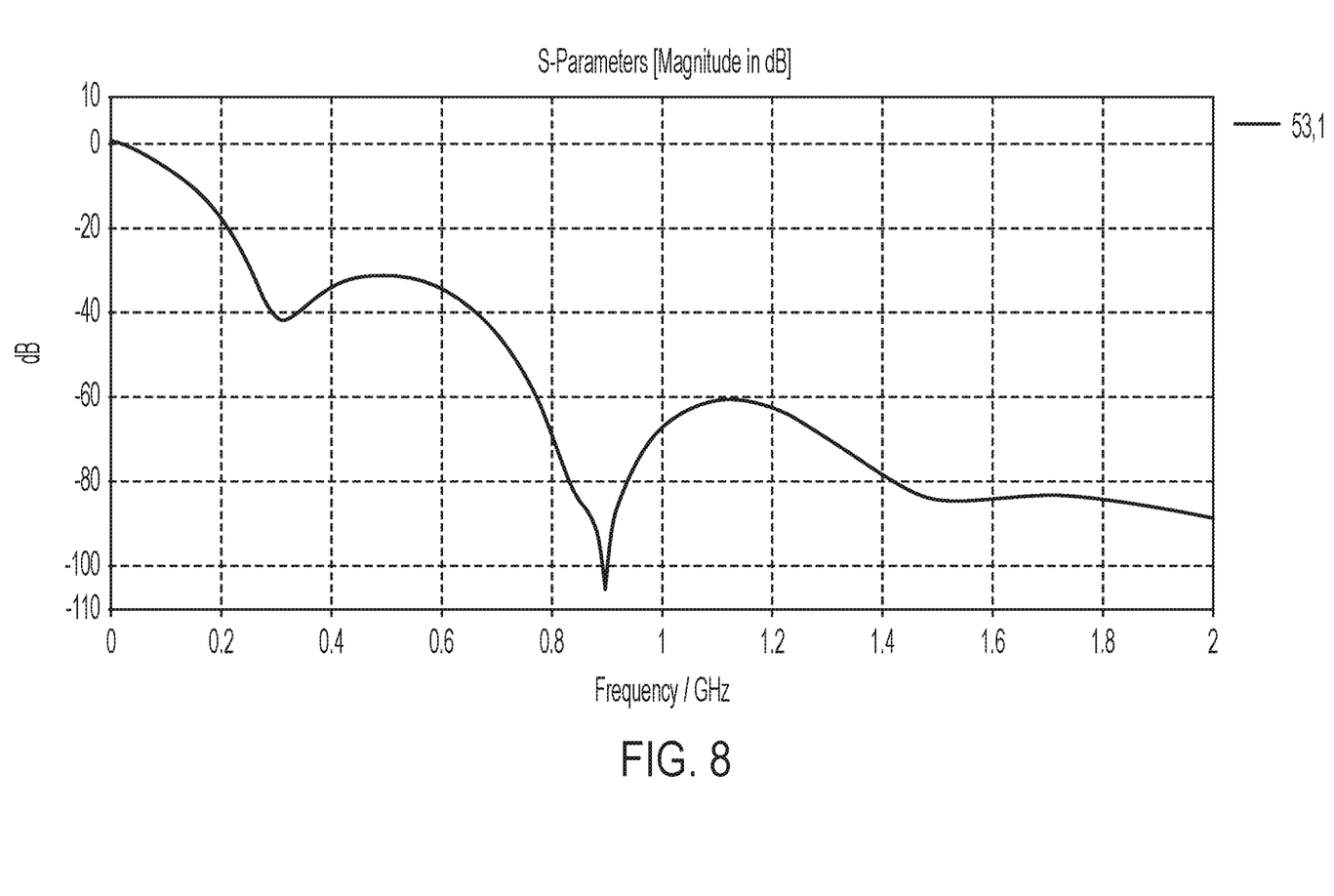
FIG. 8 is a graphical depiction of a performance of a rigid epoxy version of the connector with the conductor serpentined through the epoxy to effect a much longer length of conductor, and hence a much lower frequency band of effective RF attenuation in terms of insertion loss in a frequency band of interest.

With reference to FIGS. 7 and 8, graphical depictions of performance of the connector 101 is illustrated in terms of insertion loss in a frequency band of interest. For example, FIG. 7 illustrates the RF insertion loss of the current embodiment providing about 25 dB in a frequency band of interest. FIG. 8 illustrates an attenuation of RF at 200 MHz of about 25 dB as well as an improvement as frequency increases for a much longer implementation of the embodiment.

Technical effects and benefits of the present disclosure are the provision of an elastomeric connector 101 that is low-cost and an extremely effective filter for RF frequencies. The elastomeric connector 101 can be used for a single contact or for multiple contacts.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the technical concepts in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

While the preferred embodiments to the disclosure have been described, it will be understood that those skilled in the art, both now and in the future, may make various improvements and enhancements which fall within the scope of the claims which follow. These claims should be construed to maintain the proper protection for the disclosure first described.

What is claimed is:

1. A connector, comprising:
    a first body having first and second opposite sides and comprising an elastomeric absorber material with ferrite or iron powder dispersed therein;
    a second body comprising the elastomeric absorber material with ferrite or iron powder dispersed therein;
    a dielectric film disposed on surfaces of the first body to extend along and between the first and second opposite sides; and
    one or more conductive traces sandwiched between the second body and the dielectric film to extend along and between the first and second opposite sides.

2. The connector according to claim 1, wherein the elastomeric absorber material with ferrite or iron powder dispersed therein comprises at least one of silicone or epoxy.

3. The connector according to claim 1, wherein the elastomeric absorber material with ferrite or iron powder dispersed therein attenuates radio frequency (RF) energy in a frequency range of about 30 GHz to about 50 GHz.

4. The connector according to claim 3, wherein the elastomeric absorber material with ferrite or iron powder dispersed therein has a Shore A hardness of about 50.

5. The connector according to claim 1, wherein the one or more conductive traces comprises one of a conductive sheet and/or multiple groups of proximal conductive traces.

6. A filter interconnect assembly, comprising:
    first and second wiring boards;
    a conductive housing defining an aperture between the first and second wiring boards; and
    a connector disposable in the aperture and comprising:
    a first body having first and second opposite sides facing the first and second wiring boards, respectively, and comprising an elastomeric absorber material with ferrite or iron powder dispersed therein;
    a second body comprising the elastomeric absorber material with ferrite or iron powder dispersed therein;
    a dielectric film disposed on surfaces of the first body to extend along and between the first and second opposite sides; and
    one or more conductive traces sandwiched between the second body and the dielectric film to electrically connect the first and second wiring boards.

7. The filter interconnect assembly according to claim 6, wherein the conductive housing is formed to define the aperture as one or more apertures and the connector is provided as one or more connectors, the one or more connectors being disposable in each of the one or more apertures.

8. The filter interconnect assembly according to claim 6, wherein the elastomeric absorber material with ferrite or iron powder dispersed therein comprises at least one of silicone or epoxy.

9. The filter interconnect assembly according to claim 6, wherein the elastomeric absorber material with ferrite or iron powder dispersed therein attenuates radio frequency (RF) energy in a frequency range of about 30 GHz to about 50 GHz.

10. The filter interconnect assembly according to claim 9, wherein the elastomeric absorber material with ferrite or iron powder dispersed therein has a Shore A hardness of about 50.

11. The filter interconnect assembly according to claim 6, wherein the one or more conductive traces comprises a conductive sheet.

12. The filter interconnect assembly according to claim 6, wherein the one or more conductive traces comprises multiple groups of proximal conductive traces.

13. A filter interconnect assembly, comprising:
    first and second wiring boards;
    a conductive housing defining an aperture between the first and second wiring boards; and a connector disposable in the aperture to permit direct current (DC) to flow between the first and second wiring boards, the connector being slightly longer and narrower than the aperture and deformable in the aperture with the first and second wiring boards flush with the housing to contract in a first direction defined along a longitudinal axis of the connector and to expand in multiple second directions perpendicular to the first direction while remaining narrower than the aperture, and the connector being configured to attenuate radio frequency (RF) energy in a predefined frequency range.

14. The filter interconnect assembly according to claim 13, wherein the conductive housing is formed to define the aperture as one or more apertures and the connector is provided as one or more connectors, the one or more connectors being disposable in each of the one or more apertures.

15. The filter interconnect assembly according to claim 13, wherein the connector comprises elastomeric absorber material with ferrite or iron powder dispersed therein.

16. The filter interconnect assembly according to claim 13, wherein the connector attenuates radio frequency (RF) energy in a frequency range of about 30 GHz to about 50 GHz.

17. The filter interconnect assembly according to claim 13, wherein a length of the connector defines the predefined frequency range at which the RF energy is attenuated.

18. The filter interconnect assembly according to claim 13, wherein the connector has a Shore A hardness of about 50.

19. A monolithic microwave integrated circuit (MMIC) assembly, comprising:
an MMIC die;
first and second waveguides;
a microstrip connecting the first and second waveguides to the MMIC die; and
a filter interconnect assembly according to claim 14, wherein:
both of the first and second wiring boards are separated from each other by the conductive housing,
the conductive housing defines the one or more apertures between the first and second wiring boards,
the one or more connectors are disposable in each of the one or more apertures to permit direct current (DC) to flow between the first and second wiring boards, and
the one or more connectors are slightly longer than the one or more apertures and are deformable in the one or more apertures with the first and second wiring boards flush with the housing and are configured to attenuate radio frequency (RF) energy in a predefined frequency range.

20. The MMIC assembly according to claim 19, wherein each of the one or more connectors attenuates radio frequency (RF) energy in a frequency range of about 30 GHz to about 50 GHz and has a Shore A hardness of about 50.

* * * * *